United States Patent
Baringer et al.

(10) Patent No.: US 7,197,283 B1
(45) Date of Patent: Mar. 27, 2007

(54) DYNAMIC FREQUENCY SYNTHESIZER CONFIGURATION

(75) Inventors: William B. Baringer, Oakland, CA (US); Ozan E. Erdogan, Campbell, CA (US)

(73) Assignee: Qualcomm, Incorporated, San Diego, CA (US)

( * ) Notice: Subject to any disclaimer, the term of this patent is extended or adjusted under 35 U.S.C. 154(b) by 353 days.

(21) Appl. No.: 10/227,632

(22) Filed: Aug. 22, 2002

(51) Int. Cl.
*H04B 1/40* (2006.01)
*H04B 1/16* (2006.01)

(52) U.S. Cl. .................................. 455/76; 455/260

(58) Field of Classification Search ................ 455/76, 455/118, 260, 265, 418–420, 71; 375/132, 375/373, 376; 331/1 R, 34, 177 R
See application file for complete search history.

(56) References Cited

U.S. PATENT DOCUMENTS

| | | | | |
|---|---|---|---|---|
| 4,234,929 A | * | 11/1980 | Riley, Jr. .................... 708/101 |
| 4,688,261 A | * | 8/1987 | Killoway et al. ............. 455/76 |
| 5,493,700 A | * | 2/1996 | Hietala et al. ................ 455/75 |
| 5,619,535 A | * | 4/1997 | Alvarez, Jr. ................. 375/308 |
| 5,793,798 A | * | 8/1998 | Rudish et al. ............... 375/260 |
| 6,236,275 B1 | * | 5/2001 | Dent .......................... 331/1 A |
| 6,470,042 B1 | * | 10/2002 | Tani et al. ................... 375/132 |
| 6,584,140 B1 | * | 6/2003 | Lee ............................ 375/132 |
| 6,621,853 B1 | * | 9/2003 | Ku .............................. 375/132 |

* cited by examiner

*Primary Examiner*—Nguyen T. Vo
(74) *Attorney, Agent, or Firm*—Thomas Rouse; Charles D. Brown; Kenyon S. Jenckes

(57) ABSTRACT

A system and method are disclosed for configuring a frequency synthesizer to generate a frequency. Configuring a frequency synthesizer to generate a frequency includes transferring channel information that identifies the frequency to be generated from an external processor to the frequency synthesizer; generating a plurality of synthesizer configuration parameters based on the channel information; and configuring the frequency synthesizer using the plurality of synthesizer configuration parameters. Additionally, the frequency synthesizer configuration parameters can be generated using an iterative process with seed values.

37 Claims, 5 Drawing Sheets

DYNAMIC FREQUENCY SYNTHESIZER CONFIGURATION

CROSS REFERENCE TO RELATED APPLICATIONS

This application is related to co-pending U.S. Patent Application No. 10/227,634 by Baringer et al., entitled "PRECONFIGURED FREQUENCY SYNTHESIZER" filed concurrently herewith, which is incorporated herein by reference for all purposes; and co-pending U.S. Patent Application No. Ser. No. 10/227,633 by William Baringer, entitled "FREQUENCY SYNTHESIZER WITH ON-CHIP REGISTERS" filed concurrently herewith, which is incorporated herein by reference for all purposes.

FIELD OF THE INVENTION

The present invention relates generally to communication systems. More specifically, a frequency synthesizer design is disclosed.

BACKGROUND OF THE INVENTION

In modern communication systems, the modulation and demodulation of signals often require mixing with other signals at known frequencies. For example, in a cellular phone system, during its communication process, radio frequency (RF) signals of predetermined frequencies are mixed with the signal to be transmitted or received. The local oscillators (LO) that generate the mixer frequencies are commonly implemented by frequency synthesizers.

A frequency synthesizer needs to be configured to generate output at a desired frequency. Typically, programming a frequency synthesizer requires an external processor, such as a microcontroller, an embedded microprocessor, a baseband modem, or a similar device to compute the synthesizer configuration parameters, and then write the parameters over a bus (such as a serial bus) to the synthesizer's register bank. These data words are parameters needed by the synthesizer to configure the desired output frequency. Because of bus speed limitations, the time spent by the microcontroller to perform multiple register writes can be relatively lengthy and the power consumed during each configuration cycle can be significant.

The long initialization time and significant power consumption are particularly undesirable when the synthesizer needs to frequently change the frequency it is generating, such as when the synthesizer is operating in a frequency hopping mode. Many wireless standards support frequency hopping as a way to increase capacity, where a device that functions as a base station or an access point can transmit and receive signals with corresponding carrier frequencies that periodically hop from one channel to the next. The wireless device that communicates with the base station needs to generate one RF signal that matches one carrier frequency for demodulation, and another RF signal that matches the other carrier frequency for modulation. The synthesizers that implement the mobile device's RF LOs need to be reconfigured to generate a new frequency every time the carrier frequency hops. There are other scenarios such as handoff and standby where the synthesizer needs to be reconfigured either due to frequency change or because the synthesizer is powered off and then on. It is desirable to improve upon the current synthesizer implementation to reduce configuration overhead, achieving shorter setup time and lower power.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A synthesizer design is disclosed. The synthesizer's configuration overhead is reduced by using compressed configuration inputs and determining the synthesizer configuration parameters from the compressed configuration inputs. The functionality of generating the synthesizer configuration parameters is built into the synthesizer itself. In one embodiment, the compressed configuration inputs are sent from an external source. In one embodiment, the compressed configuration inputs are stored in memory and retrieved during configuration. In one embodiment, the synthesizer configuration parameters are computed based on the compressed configuration inputs and their offset values. In certain embodiments, a combination of these techniques is used. In some embodiments, the techniques disclosed are also applicable to offset phase locked loops as well as frequency translators used in constant envelope modulation transmitters. The frequency synthesizer may be used in a variety of device, for example, direct conversion receivers, superheterodyne transceivers, low intermediate frequency receivers, etc.

Figure 1:
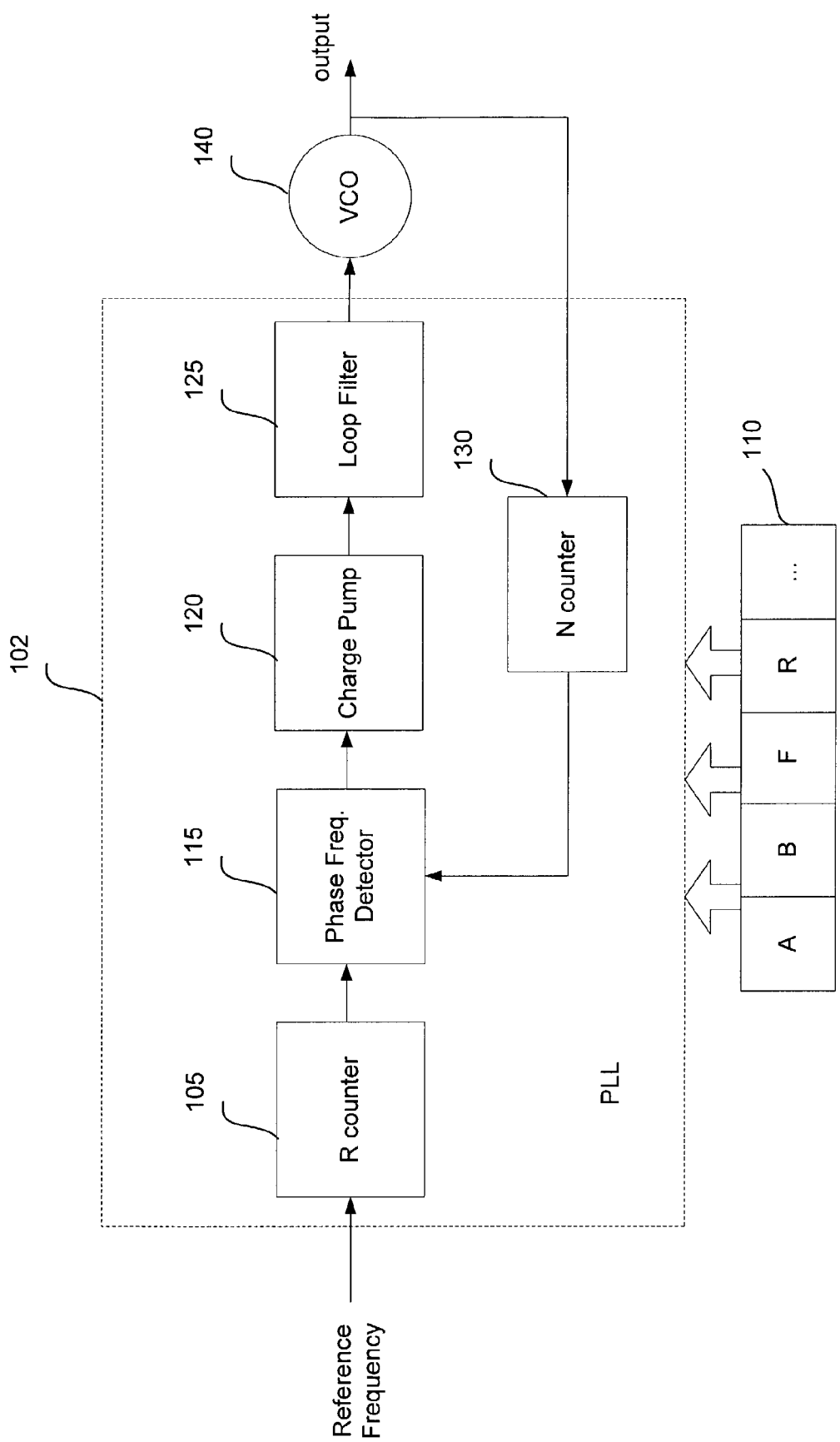
FIG. 1 is a block diagram of a frequency synthesizer system.

The following is a review of how a synthesizer is configured. FIG. 1 is a block diagram of a frequency synthesizer system. Box 102 is a phase locked loop (PLL) which is essentially a feedback control system that controls the phase of a voltage controlled oscillator (VCO). The input to the PLL is a signal with a stable reference frequency. A temperature controlled crystal oscillator (TCXO) is one example of such a reference source. The reference frequency is divided by R using R counter 105. The divided frequency is one input into phase frequency detector (PFD) 115, while the other input into the PFD is the output signal divided by N using N counter 130 (also referred to as divider). The output of the PFD is a signal proportional to the phase difference between the two inputs. This signal is sent to charge pump 120 then applied to loop filter 125. The filtered signal controls voltage controlled oscillator (VCO) 140. By adjusting the N and R values, the synthesizer can be configured to generate different frequencies.

The output frequency $f_{vco}$ is expressed as $$f_{vco} = N \times f_{osc}/R,$$

where R is the preset value of divide-by-R counter, N is the preset value of the divide-by-N counter as defined below, $f_{osc}$ is the reference frequency generated by the TCXO.

In an integer-N PLL, N can be represented as $$N = P \times B + A$$

In a fractional-N PLL, N can be represented as $$N = P \times B + A + C + F/2^K,$$

where P is a preset prescaler modulus, and A, B and F are integer preset values for various counters, and K is typically a constant for a given implementation. C is a fractional constant. In one embodiment, the value for C is 0.5. In the embodiment depicted in FIG. 1, A, B, F and R values are loaded into register bank 110 and then used by the PLL for outputting the desired frequency. In other embodiments, other synthesizer configuration parameters are used by the PLL or by other parts of the synthesizer.

In general, a channel or frequency is specified for a receiver according to a protocol. In many existing implementations, a microprocessor or a baseband modem calculates the synthesizer configuration parameters based on the specified channel information (also referred to as frequency information or frequency identifier), and then writes these parameters to the synthesizer, often through a serial bus.

In one embodiment, the need for the baseband modem to compute the synthesizer configuration parameters, and then write them to the synthesizer, is avoided by transferring channel information from the baseband modem to the synthesizer system. The functionality of generating the synthesizer configuration parameters is moved into the synthesizer, as part of either a single synthesizer chip or a synthesizer chip set. The microcontroller, microprocessor or baseband modem sends the channel information to the synthesizer, thus the number of bits transferred is greatly reduced. The channel information transferred from the external processor fully determines the synthesizer configuration parameters and is a compressed form of the synthesizer configuration parameters. The synthesizer uses the channel information to do its own computation, lookup, or combination of computation and lookup to come up with the set of synthesizer configuration parameters. The resulting compression of transferred data can result in shorter transfer times and lower overall power consumption.

For example, in GSM, the Absolute Radio Frequency Channel Number (ARFCN) is used to map hundreds of frequencies to their corresponding channel numbers. Table 1 contains examples of mapping of the ARFCN to the desired carrier frequency used in the EGSM, DCS and PCS frequency bands. Column 1 contains some of the ARFCN values used in these standards. Column 2 contains the carrier frequencies that correspond to the ARFCN. Column 3 contains the local oscillator (LO) frequencies that the synthesizer must generate. The LO frequency differs from the carrier frequency by an amount equal to the intermediate frequency (IF); in the example in Table 1, an IF of 100 kHz is shown for each of the transmit and receive LO frequencies. Since the channel numbers are reused for transmit and receive frequencies, the channel information sent to the synthesizer must contain additional information indicating whether the signal is used for transmit or receive.

TABLE 1

| | Carrier Frequency, MHz | LO Frequency, MHz |
|---|---|---|
| EGSM ARFCN | | |
| Receive | = 935 + 0.2 * ARFCN for 0 ≦ ARFCN ≦ 124; = 935 + 0.2 * (ARFCN − 1024) for 975 ≦ ARFCN ≦ 1023 | |
| 975 | 925.2 | 925.3 |
| 976 | 925.4 | 925.5 |
| 1023 | 934.8 | 934.9 |
| 0 | 935.0 | 935.1 |
| 1 | 935.2 | 935.3 |
| 124 | 959.8 | 959.9 |
| Transmit | = 890 + 0.2 * ARFCN for 0 ≦ ARFCN ≦ 124; = 890 + 0.2 * (ARFCN − 1024) for 975 ≦ ARFCN ≦ 1023 | |
| 975 | 880.2 | 880.3 |
| 976 | 880.4 | 880.5 |
| 1023 | 889.8 | 889.9 |
| 0 | 890.0 | 890.1 |
| 1 | 890.2 | 890.3 |
| 124 | 914.8 | 914.9 |
| DCS ARFCN | | |
| Receive | = 1805.2 + 0.2 * (ARFCN − 512) for 512 ≦ ARFCN ≦ 885 | |
| 512 | 1805.2 | 1805.3 |
| 513 | 1805.4 | 1805.5 |
| 884 | 1879.6 | 1879.7 |
| 885 | 1879.8 | 1879.9 |
| Transmit | = 1710.2 + 0.2 * (ARFCN − 512) for 512 ≦ ARFCN ≦ 885 | |
| 512 | 1710.2 | 1710.3 |
| 513 | 1710.4 | 1710.5 |
| 884 | 1784.6 | 1784.7 |
| 885 | 1784.8 | 1784.9 |
| PCS ARFCN | | |
| Receive | = 1930.2 + 0.2 * (ARFCN − 512) for 512 ≦ ARFCN ≦ 810 | |
| 512 | 1930.2 | 1930.3 |
| 513 | 1930.4 | 1930.5 |
| 809 | 1989.6 | 1989.7 |
| 810 | 1989.8 | 1989.9 |
| Transmit | = 1850.2 + 0.2 * (ARFCN − 512) for 512 ≦ ARFCN ≦ 810 | |
| 512 | 1850.2 | 1850.3 |
| 513 | 1850.4 | 1850.5 |
| 809 | 1909.6 | 1909.7 |
| 810 | 1909.8 | 1909.9 |

Figure 2:
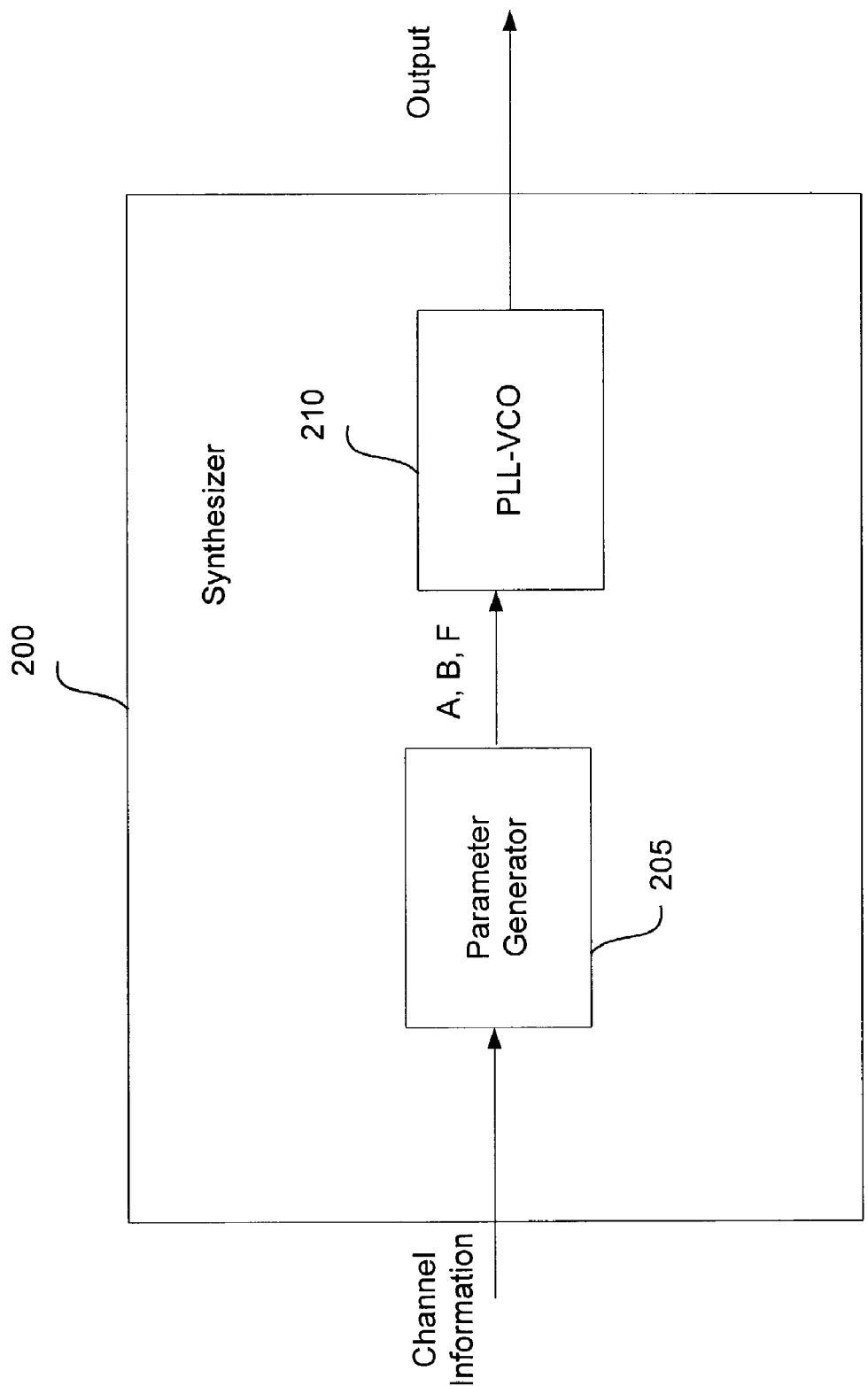
FIG. 2 is a block diagram illustrating how the channel information is used to configure a synthesizer.

For the purposes of this specification, only ARFCN-to-frequency mapping is discussed in detail. It should be noted that the same architecture and methods described are equally applicable to other wireless standards that use other frequency identification schemes. FIG. 2 is a block diagram illustrating how the channel information is used to configure a synthesizer. The input to synthesizer 200 is channel information including the ARFCN, frequency band selection, transmit-receive (T/R) selection, and appropriate IF value. Alternatively, since the IF value is typically a constant for a given system, its value can be embedded into the parameter generator. Parameter generator 205 calculates the A, B, R, and F synthesizer configuration parameter values that correspond to the given ARFCN, band selection, T/R selection, and IF value. The resulting values are used to configure PLL-VCO 210 for outputting the desired frequency. Note that parameter generator 205 can be implemented as a lookup table (LUT), a compute engine, or a combination of both, in either hardware or software.

In one embodiment, the synthesizer configuration parameters are stored in a LUT, with the frequency identifier as the key (or index) for looking up the parameters. Table 2 illustrates sample entries in a LUT used for a given TCXO with a fixed R and a fixed K, to generate receive frequencies for the EGSM 900 standard. In this embodiment, the value for the constant prescaler P is 8. Using the ARFCN as a key into the table, with a receive IF of 100 kHz, a corresponding set of A, B, F values (hereafter referred to as ABF) are located and used by the synthesizer to configure its circuitry to generate the desired frequency.

TABLE 2

| ARFCN | B | A | F | LO Freq, MHz |
|---|---|---|---|---|
| 975 | 8 | 6 | 5678422 | 925.3 |
| 976 | 8 | 6 | 5807498 | 925.5 |
| 977 | 8 | 6 | 5936553 | 925.7 |
| 978 | 8 | 6 | 6065609 | 925.9 |
| 979 | 8 | 6 | 6194664 | 926.1 |
| 980 | 8 | 6 | 6323720 | 926.3 |
| 981 | 8 | 6 | 6452775 | 926.5 |

The entries in the LUT can also be compressed values used to derive the synthesizer configuration parameters. These values can be significantly shorter than the synthesizer configuration parameters, thereby reducing memory requirement of the LUT. The frequency identifier is again used as a key into the table, and the values that are looked up can be converted to the synthesizer configuration parameter by a compute engine. In one embodiment, the table stores not the actual synthesizer configuration parameters but differential data (also referred to as deltas), describing the change in parameters from the previous channel number. The frequency identifier is comprised of the frequency band of interest (e.g., EGSM, DCS, or PCS), the ARFCN, and a transmit/receive bit. The ABF for the first frequency identifier is known. The ABF for the second frequency identifier is the first ABF plus the delta entries for the second frequency identifier; the ABF for the third frequency identifier is the second ABF plus the third delta entries, and so on. The ABF for a given frequency identifier is thus calculated by consecutive additions based on the first ABF and the delta values in the table.

In another embodiment, the table entries are double differential data, describing the change in the change of ABF from the previous channel. The ABF for a given frequency identifier can be computed based the first ABF, its delta with the second ABF, and consecutive double differential values.

The synthesizer configuration parameters can also be calculated based on the channel information, to eliminate the need to store the parameters in a LUT. In one embodiment, the synthesizer configuration parameters are computed based on the channel information and the formulas previously shown. However, the computation tends to require difficult fixed-point and possibly floating-point operations, including multiplies and divides. Therefore, it is unduly complex and unsuitable for implementation by circuits that do not support floating-point operations. In one embodiment, the regularity of the synthesizer configuration parameters is exploited, and an iterative process is used to compute the parameters using simpler instructions comprised of addition, subtraction and comparison. A suitable seed for each of the parameters is first selected. The successive values for the parameters are computed iteratively using formulas that are based on the seed, values of previous entries, and/or states of other entries. Additional parameters may also be used to assist the calculations.

The following illustrates one embodiment of a compute engine for iteratively calculating fractional-N values for a frequency synthesizer for outputting frequencies used in PCS 1900 standard. It should be noted that the same architecture and methods described are equally applicable to other standards. The values shown are values used in this embodiment. In other embodiments, other values may be used.

The following are notations and values used for the formulas:

$f_{osc}$: Reference frequency, 13 MHz.
$f_{max}$: Maximum fractional-N frequency, 8388608 Hz.
P: Prescaler modulus, set to 8.
R: Preset value of divide-by-R counter, set to 2
n: Subscript, used to indicate the number of iterations starting from 0.
$A_n$: Value of A for a current entry. Stored in a 3 bit counter.
$A_{n-1}$: Value of A for a previous entry.
$A_0$: Seed value for A, set to 3 in this example. Preloaded into the 3 bit counter for A.
$B_n$: Value of B for a current entry.
$B_{n-1}$: Value of B for a previous entry. Stored in a 5 bit counter.
$B_0$: Seed value for B, set to 18 in this example. Preloaded into the 5 bit counter for B.
$F_n$: Value of F for a current entry. Stored in a 23 bit counter.
$F_{n-1}$: Value of F for a previous entry.
$F_0$: Seed value for F, set to 8065969 in this example. Preloaded into the 23 bit counter for F.
I: Increment of F for every 100 kHz increment in output frequency $f_{vco}$ Fixed at 64527.
$C_n$: Current entry value of a slip counter. The counter is 8 bit, starts counting at value $C_0$, counts up to 130, then resets to 1 and counts up to 130 again.
$C_0$: Seed value for C, set to 123. Preloaded into the slip counter.
$T_n$: Current entry value of a 1-bit register. It toggles between 0 and 1, and adjusts the F value.
$T_{n-1}$: Previous entry of T.
$T_0$: Seed value for T, set to 1.

The following are how current entries $A_n$, $B_n$ and $F_n$ are obtained. $C_n$ and $T_n$ must first be computed to get $A_n$, $B_n$ and $F_n$.

$C_n$:   if $C_{n-1} + 1 > 130$
        $C_n = C_{n-1} + 1 - 130$
    else
        $C_n = C_{n-1} + 1$ $T_n$:   if $(T_{n-3} + T_{n-2} + T_{n-1})$ is equal to 3
        if (($C_n$ is equal to 65) or ($C_n$ is equal to 130))
            $T_n = 1$
        else
            $T_n = 0$
    else
        $T_n = 1$ -continued $A_n$:     if ($C_n$ is equal to 129)
        if ($A_{n-1}$ + 1 is equal to 8)
            $A_n = 0$
        else
            $A_n = A_{n-1} + 1$
    else
        $A_n = A_{n-1}$ $F_n$:     if ($F_{n-1} + A_n + I > f_{max}$)
        $F_n = F_{n-1} + A_n + I - f_{max}$
    else
        $F_n = F_{n-1} + A_n + I$ $B_n$:     if ( ($A_{n-1}$ is equal to 7) and ($A_n$ is equal to 0) )
        $B_n = A_{n-1} + 1$
    else
        $B_n = A_{n-1}$ Table 3 contains sample entry values for the embodiment discussed above. Every other row in this table contains a frequency that corresponds to an ARFCN value, beginning with 512. For a given ARFCN, the compute engine can iteratively calculate sets of values to produce the synthesizer configuration parameters corresponding to the given ARFCN.

TABLE 3

| ARFCN | C | T | B | A | F | Freq, MHz |
|---|---|---|---|---|---|---|
| Seed | 123 | 1 | 18 | 3 | 8065969 | 1930.0 |
|  | 124 | 1 | 18 | 3 | 8130497 | 1930.1 |
|  | 125 | 1 | 18 | 3 | 8195025 | 1930.2 |
| 512 | 126 | 0 | 18 | 3 | 8259552 | 1930.3 |
|  | 127 | 1 | 18 | 3 | 8324080 | 1930.4 |
| 513 | 128 | 1 | 18 | 3 | 8388608 | 1930.5 |
|  | 129 | 1 | 18 | 4 | 64528 | 1930.6 |
| 514 | 130 | 1 | 18 | 4 | 129056 | 1930.7 |
|  | 1 | 0 | 18 | 4 | 193583 | 1930.8 |
| 515 | 2 | 1 | 18 | 4 | 258111 | 1930.9 |
|  | 3 | 1 | 18 | 4 | 322639 | 1931.0 |
| 516 | 4 | 1 | 18 | 4 | 387167 | 1931.1 |
|  | 5 | 0 | 18 | 4 | 451694 | 1931.2 |
| 517 | 6 | 1 | 18 | 4 | 516222 | 1931.3 |
|  | 7 | 1 | 18 | 4 | 580750 | 1931.4 |
| 518 | 8 | 1 | 18 | 4 | 645278 | 1931.5 |
|  | 9 | 0 | 18 | 4 | 709805 | 1931.6 |
| 519 | 10 | 1 | 18 | 4 | 774333 | 1931.7 |
|  | 11 | 1 | 18 | 4 | 838861 | 1931.8 |
| 520 | 12 | 1 | 18 | 4 | 903389 | 1931.9 |
|  | 13 | 0 | 18 | 4 | 967916 | 1932.0 |
| 521 | 14 | 1 | 18 | 4 | 1032444 | 1932.1 |
|  | 15 | 1 | 18 | 4 | 1096972 | 1932.2 |

Figure 3:
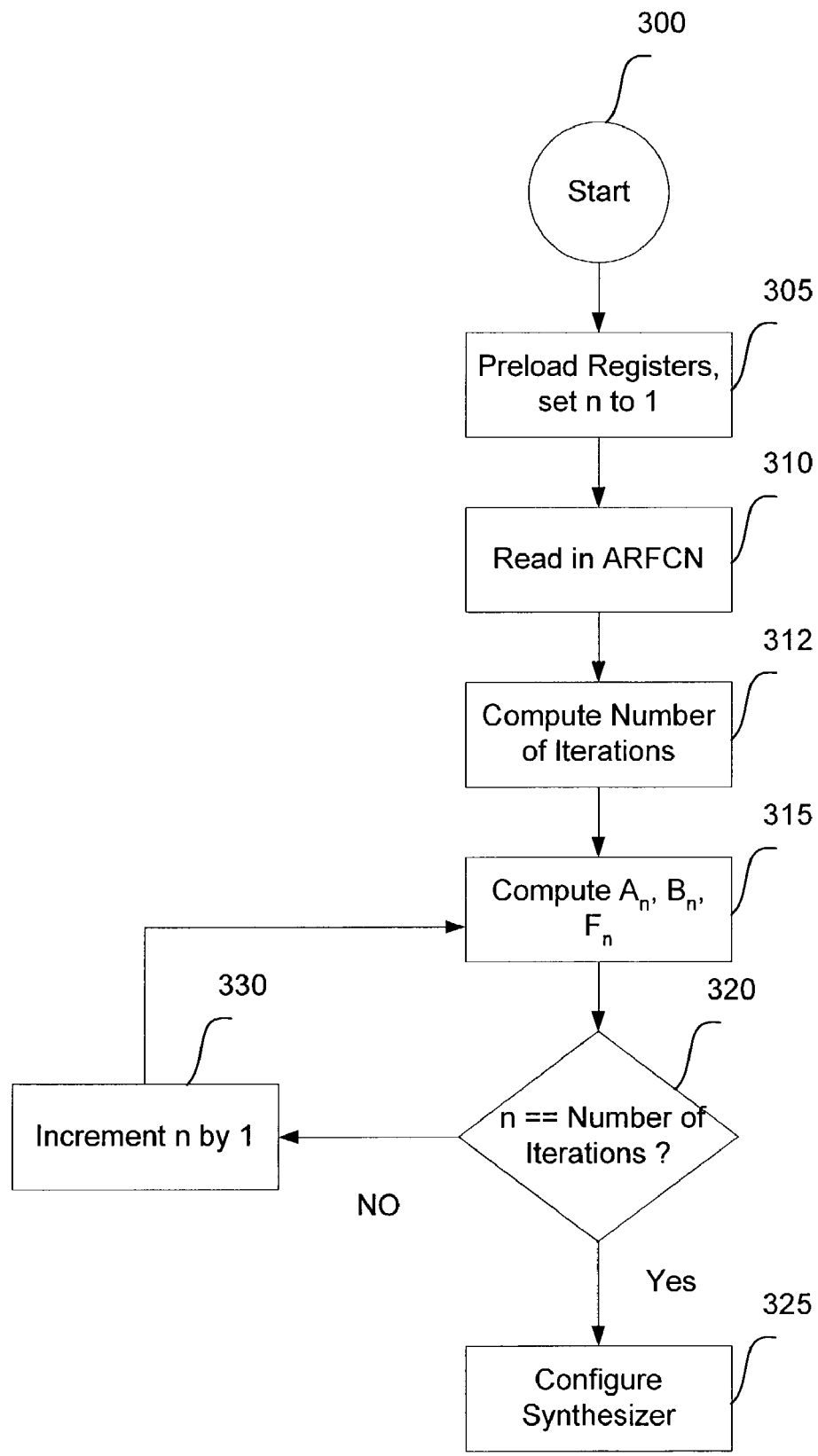
FIG. 3 is a flowchart illustrating how the compute engine carries out calculations for synthesizer configuration parameters in one embodiment.

FIG. 3 is a flowchart illustrating how the compute engine carries out calculations for synthesizer configuration parameters in one embodiment. The flowchart starts at 300. In step 305, the seed values are loaded into the appropriate registers or counters. An iteration counter used to count the number of iterations, n, is initialized to 1. At this point the compute engine is ready to do calculations. In step 310, an ARFCN is read in. In step 312, the number of iterations needed is computed as 2-(ARFCN-512)+2. In step 315, $A_n$, $B_n$ and $F_n$ are computed for n is equal to 1. In step 320, n is compared with 2-(ARFCN-512)+2. If n is equal to 2-(ARFCN-512)+2, control is transferred to step 325, where the synthesizer is configured using the resulting synthesizer configuration parameters. If n does not equal 2-(ARFCN-512)+2, then control is transferred to step 330, where n is incremented by 1. From step 330, control goes back to step 312 where a new set of $A_n$, $B_n$ and $F_n$ are computed using the new n. In other embodiments, the calculation for the entries that do not correspond to an ARFCN can be skipped to save cycles.

While the compute engine based on the seed values can be implemented relatively simply, for higher ARFCN values the iteration can take a long time. To improve performance, the table of ARFCN values can be split into multiple table sections, wherein each section starts with a new set of seed values. There is a search that is done when the ARFCN is received, to locate the correct table section that includes the particular ARFCN. Table 4 illustrates one embodiment using the iterative process with multiple table sections with their own seeds. Four table sections are created with ARFCN ranges of 512–585, 586–659, 660–733 and 734–810, respectively. Each of the sections has its own set of seeds. For example, if the ARFCN is 689, then the third section is determined to be the one that contains such an ARFCN and the seeds for the third section are used. Iterative calculation is done using the seeds for section 3, as shown in the line "Seed S3" in Table 4. Thus, by splitting the table into multiple table sections to create a coarse lookup table, and selecting the appropriate table section for a given ARFCN input, the number of iterations used is significantly reduced. This process may be viewed as creating a hybrid between a strict lookup table approach, and a strict iterative compute engine approach.

TABLE 4

|  | C | T | B | A | F | Freq, MHz |
|---|---|---|---|---|---|---|
| Section 1 |  |  |  |  |  |  |
| Seed S1 | 125 | 1 | 18 | 3 | 8195025 | 1930.2 |
| 512 | 126 | 0 | 18 | 3 | 8259552 | 1930.3 |
|  | 127 | 1 | 18 | 3 | 8324080 | 1930.4 |
| 513 | 128 | 1 | 18 | 3 | 8388608 | 1930.5 |
|  | 129 | 1 | 18 | 4 | 64528 | 1930.6 |
| . . . | . . . | . . . | . . . | . . . | . . . | . . . |
| 585 | 11 | 1 | 18 | 5 | 903389 | 1944.9 |
| Section 2 |  |  |  |  |  |  |
| Seed S2 | 13 | 0 | 18 | 5 | 967916 | 1945.0 |
| 586 | 14 | 1 | 18 | 5 | 1032444 | 1945.1 |
|  | 15 | 1 | 18 | 5 | 1096972 | 1945.2 |
| 587 | 16 | 1 | 18 | 5 | 1161500 | 1945.3 |
|  | 17 | 0 | 18 | 5 | 1226027 | 1945.4 |
| . . . | . . . | . . . | . . . | . . . | . . . | . . . |
| 659 | 29 | 0 | 18 | 6 | 2064888 | 1959.7 |
| Section 3 |  |  |  |  |  |  |
| Seed S3 | 31 | 1 | 18 | 6 | 2129416 | 1959.8 |
| 660 | 32 | 1 | 18 | 6 | 2193944 | 1959.9 |
|  | 33 | 0 | 18 | 6 | 2258471 | 1960.0 |
| 661 | 34 | 1 | 18 | 6 | 2322999 | 1960.1 |
|  | 35 | 1 | 18 | 6 | 2387527 | 1960.2 |
| . . . | . . . | . . . | . . . | . . . | . . . | . . . |
| 733 | 47 | 1 | 18 | 7 | 3226388 | 1974.5 |
| Section 4 |  |  |  |  |  |  |
| Seed S4 | 49 | 0 | 18 | 7 | 3290915 | 1974.6 |
| 734 | 50 | 1 | 18 | 7 | 3355443 | 1974.7 |
|  | 51 | 1 | 18 | 7 | 3419971 | 1974.8 |
| 735 | 52 | 1 | 18 | 7 | 3484499 | 1974.9 |
|  | 53 | 0 | 18 | 7 | 3549026 | 1975.0 |
| . . . | . . . | . . . | . . . | . . . | . . . | . . . |
| 810 | 71 | 1 | 19 | 0 | 4775054 | 1989.9 |

In some embodiments, the synthesizer design is used in combination with storing the register values in non-volatile memory for better efficiency as is described in Baringer, Ser. No. 10/227,633, which was previously incorporated by reference. Examples of non-volatile memory include non-volatile RAM, ROM, and as well as power supplied memory storage such as battery backed RAM, fuel cell backed RAM, etc. These types of memory persist the values that would be lost if stored in volatile memory. When the synthesizer is powered off, its synthesizer configuration parameters are persisted and do not need to be reloaded. Thus, the synthesizer saves time and energy when it switches on again.

Fractional-N PLLs are sometimes used to fine-tune the synthesizer frequency. Ideally, a stable and accurate reference frequency source is required for producing the desired synthesizer frequency. In practice, such a reference source may be expensive. By using a fractional-N PLL, the synthesizer configuration parameters can be adjusted to compensate for the drift in reference frequency, thereby allowing the synthesizer to be implemented using less accurate and cheaper parts for its reference source.

Figure 4:
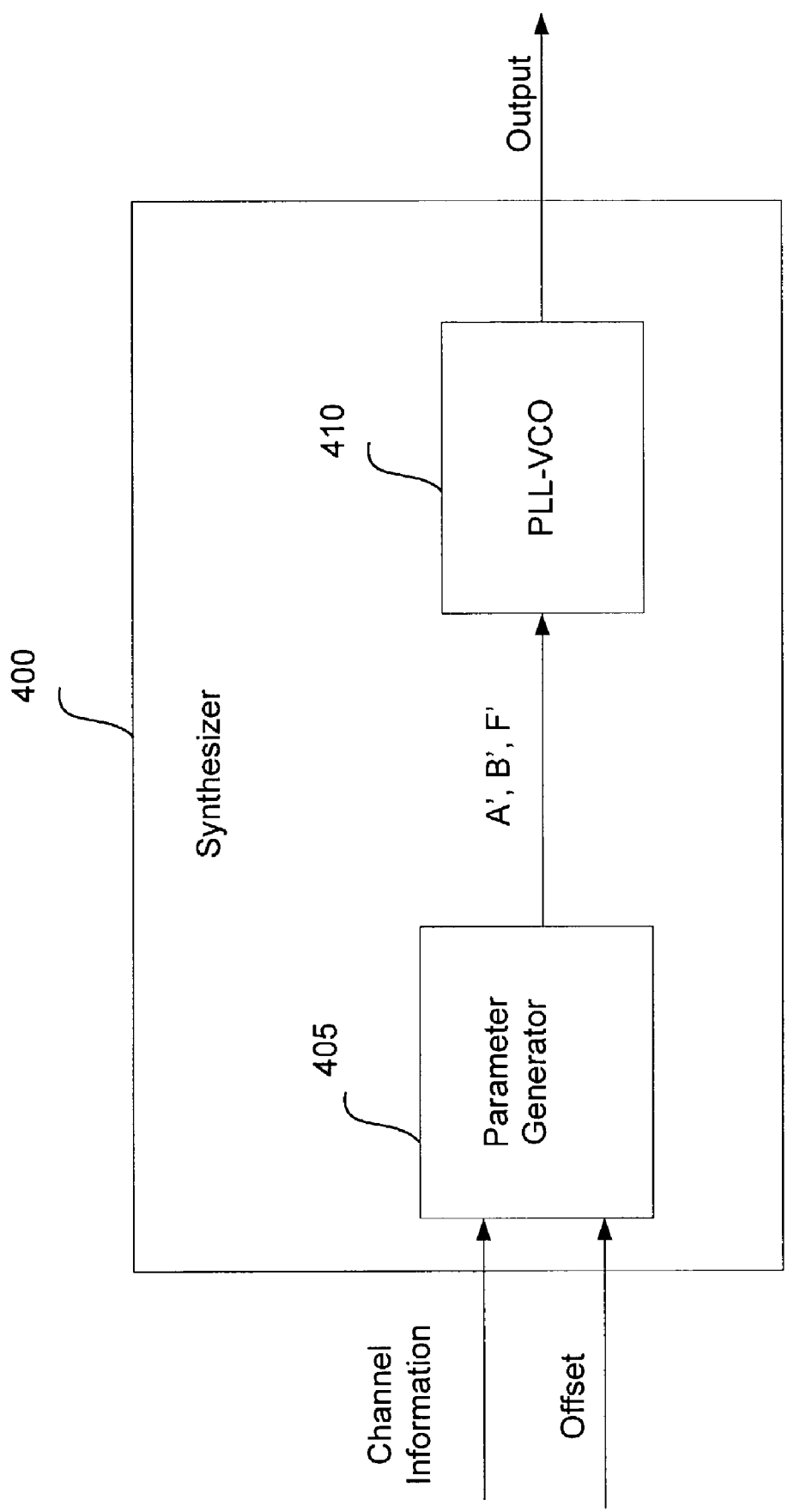
FIG. 4 is a block diagram of a synthesizer that adjusts its output using some offset values.

In one embodiment, the inputs to the synthesizer are the channel information plus offset values for the synthesizer configuration parameters. FIG. 4 is a block diagram of a synthesizer that adjusts its output using some offset values. The inputs to the synthesizer 400 include the ARFCN, frequency band selection, transmit-receive selection, IF value, plus some offset values. The R counter value and exponent value K are fixed as constants for this fractional-N synthesizer example. Parameter generator 405 calculates the nominal A, B, and F that correspond to the given ARFCN, and then combines the resulting values with the offset values to produce a new set of values A', B', F' that are adjusted for the offsets. The adjusted values are used as synthesizer configuration parameters of PLL-VCO 410 for outputting the desired frequency. There may be one or more offset values. In one embodiment, the offset values are $A_0$, $B_0$ and $F_0$. In one embodiment, $F_0$ is used as an input offset value. In certain embodiments, a delta frequency is used as the offset. These techniques are sometimes used to compensate for drift in the synthesizer's output frequency caused by factors such as temperature change.

In various embodiments, the offset values are determined in different ways. For example, in one embodiment, the data or symbols being recovered by the receiver are analyzed to determine whether adjustments should be made to the synthesizer frequency output. Feedback from the analysis is provided to determine the offset.

Figure 5:
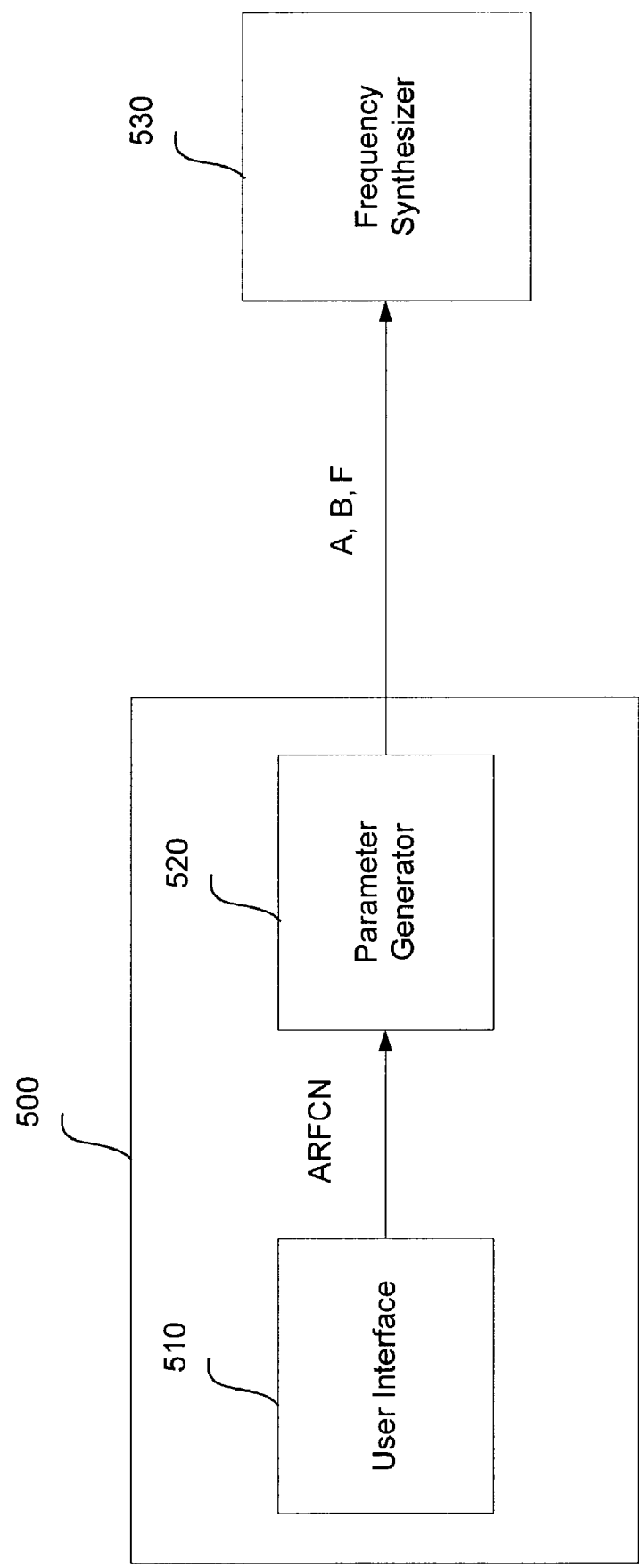
FIG. 5 illustrates one embodiment of a synthesizer test system.

After being manufactured, synthesizers that do not use the compression techniques described above, must be tested for their accuracy. Typically, the user must enter the actual A, B and F values to configure and test the synthesizers. The techniques described above may be used in a test equipment set up to enable simpler user input. In one embodiment of a synthesizer's test equipment, a user interface allows the user to enter the channel information directly (i.e., the ARFCN or other appropriate frequency identifier). The test equipment then automatically configures the synthesizer's output. The user interface can be either graphical or command line based. FIG. 5 illustrates one embodiment of a synthesizer test system. Test program 500 includes user interface module 510 that allows the user to enter the channel information directly. The input channel information, such as the ARFCN, is sent to parameter generation module 520 to generate the synthesizer configuration parameters. The resulting configuration parameter outputs are applied to synthesizer 530 to generate the test frequency desired.

A frequency synthesizer design has been described. The synthesizer has the capability to compute its synthesizer configuration parameters based on compressed channel information it receives, and thereby allowing for faster configuration and lower power consumption.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of configuring a frequency synthesizer to generate a frequency including:
    transferring channel information that identifies the frequency to be generated, from an external processor to the frequency synthesizer;
    generating a plurality of synthesizer configuration parameters based on the channel information;
    inputting an offset value for the plurality of synthesizer configuration parameters, wherein the offset value is $F_0$; and
    configuring the frequency synthesizer using the plurality of synthesizer configuration parameters, wherein
    generating the plurality of synthesizer configuration parameters includes computing the plurality of synthesizer configuration parameters using an iterative process with a set of seed values.

2. A method of configuring a frequency synthesizer as recited in claim 1 wherein the frequency synthesizer includes a fractional N phase locked loop.

3. A method of configuring a frequency synthesizer as recited in claim 1 wherein the frequency synthesizer includes an integer N phase locked loop.

4. A method of configuring a frequency synthesizer as recited in claim 1 wherein the frequency synthesizer is a part of a direct conversion receiver.

5. A method of configuring a frequency synthesizer as recited in claim 1 wherein the frequency synthesizer is a part of a superheterodyne transceiver.

6. A method of configuring a frequency synthesizer as recited in claim 1 wherein the frequency synthesizer is part of a low intermediate frequency receiver.

7. A method of configuring a frequency synthesizer as recited in claim 1 wherein the channel information includes Absolute Radio Frequency Channel Number (ARFCN).

8. A method of configuring a frequency synthesizer as recited in claim 1 wherein the external processor is a baseband modem, a microcontroller, or a microprocessor.

9. A method of configuring a frequency synthesizer as recited in claim 1 wherein generating the plurality of synthesizer configuration parameters includes looking up the synthesizer configuration parameters in a lookup table.

10. A method of configuring a frequency synthesizer as recited in claim 1 wherein generating the plurality of synthesizer configuration parameters includes looking up differential data in a lookup table and calculating the synthesizer configuration parameters using the differential data.

11. A method of configuring a frequency synthesizer as recited in claim 1 wherein generating the plurality of synthesizer configuration parameters includes looking up double differential data in a lookup table and calculating the synthesizer configuration parameters using the double differential data.

12. A method of configuring a frequency synthesizer as recited in claim 1 wherein generating the plurality of synthesizer configuration parameters includes using the channel information and a set of formulas.

13. A method of configuring a frequency synthesizer as recited in claim 1 further includes locating fie channel information in a plurality of table sections wherein each of the plurality of table sections has a corresponding set of seed values;
wherein generating the plurality of synthesizer configuration parameters includes using an iterative process with the corresponding set of seed values.

14. A method of configuring a frequency synthesizer as recited in claim 1 wherein the synthesizer configuration parameters are stored in non-volatile memory.

15. A method of configuring a frequency synthesizer as recited in claim 1 wherein the synthesizer configuration parameters are stored in power supplied memory.

16. A method of configuring a frequency synthesizer as recited in claim 1 further including inputting a plurality of offset values for the plurality of synthesizer configuration parameters.

17. A method of configuring a frequency synthesizer as recited in claim 1 further including inputting an offset value for a synthesizer configuration parameter.

18. A method of configuring a frequency synthesizer as recited in claim 1 further including inputting an offset value for the plurality of synthesizer configuration parameters.

19. A method of configuring a frequency synthesizer as recited in claim 1 further including inputting an offset value for the plurality of synthesizer configuration parameters, wherein the offset value is a delta frequency.

20. A frequency synthesizer inducing:
an interface that receives channel information that identifies a frequency to be generated;
a parameter generator that generates a plurality of synthesizer configuration parameters based on the channel information; and
a memory using the plurality of synthesizer configuration parameters to configure the frequency synthesizer to generate the frequency,
wherein the interface is a first interface;
further including a second interface for receiving a an offset value; wherein:
the parameter generator generates a plurality of nominal synthesizer configuration parameters that are combined with the offset value to generate the plurality of synthesizer configuration parameters; and
the offset value is $F_0$.

21. A frequency synthesizer as recited in claim 20 further including a fractional N phase locked loop.

22. A frequency synthesizer as recited in claim 20 further including an integer N phase locked loop.

23. A frequency synthesizer as recited in claim 20 wherein the frequency synthesizer is a part of a direct conversion receiver.

24. A frequency synthesizer as recited in claim 20 wherein the frequency synthesizer is a part of a superheterodyne receiver.

25. A frequency synthesizer as recited in claim 20 wherein the frequency synthesizer is a part of a low intermediate frequency receiver.

26. A frequency synthesizer as recited in claim 20 wherein the channel information includes Absolute Radio Frequency Channel Number (ARFCN).

27. A frequency synthesizer as recited in claim 20 wherein the channel information is received from a baseband modem, a microcontroller, or a microprocessor.

28. A frequency synthesizer as recited in claim 20 wherein the parameter generator includes a lookup table.

29. A frequency synthesizer as recited in claim 20 wherein the parameter generator comprises a lookup table with differential data and a compute engine that uses the differential data to compute the plurality of synthesizer configuration parameters.

30. A frequency synthesizer as recited in claim 20 wherein the parameter generator comprises a lookup table with double differential data and a compute engine that uses the double differential data to compute the synthesizer configuration parameters.

31. A frequency synthesizer as recited in claim 20 wherein the parameter generator includes a compute engine that uses the channel information and a set for formulas to generate the plurality of synthesizer configuration parameters.

32. A frequency synthesizer as recited in claim 20 wherein:
the parameter generator includes a plurality of table sections comprising channel information wherein each of the plurality of table sections has a corresponding et of seed values; and
the parameter generator further includes a compute engine that uses the plurality of table sections to iteratively compute the plurality of synthesizer configuration parameters.

33. A frequency synthesizer as recited in claim 20 wherein the plurality of synthesizer configuration parameters are stored in non-volatile memory.

34. A frequency synthesizer as recited in claim 20 wherein the plurality of synthesizer configuration parameters are stored in power supplied memory.

35. A frequency synthesizer as recited in claim 20 wherein the interface is a first interface;
further including a second interface for receiving a plurality of offset values;
wherein the parameter generator generates a plurality of nominal synthesizer configuration parameters that me combined with the plurality of offset values to generate the plurality of synthesizer configuration parameters.

36. A frequency synthesizer as recited in claim 20 wherein the interface is a first interface;
further including a second interface for receiving an offset value;
wherein the parameter generator generates a nominal synthesizer configuration parameter that is combined with the offset value to generate one of the plurality of synthesizer configuration parameters.

37. A frequency synthesizer as recited in claim 20 wherein the interface is a first interface;
further including a second interface for receiving a an offset value; wherein:
the parameter generator generates a plurality of nominal synthesizer configuration parameters that are combined with the offset value to generate the plurality of synthesizer configuration parameters; and
the offset value is a delta frequency.

* * * * *